US009075120B2

(12) United States Patent
Shinagawa et al.

(10) Patent No.: US 9,075,120 B2
(45) Date of Patent: Jul. 7, 2015

(54) SHIMMING DEVICE FOR SUPERCONDUCTING MAGNET

(75) Inventors: Hideyuki Shinagawa, Tsukuba (JP); Shinobu Ohki, Tsukuba (JP); Tadashi Shimizu, Tsukuba (JP)

(73) Assignee: NATIONAL INSTITUTE FOR MATERIALS SCIENCE, Ibaraki (JP)

( * ) Notice: Subject to any disclaimer, the term of this patent is extended or adjusted under 35 U.S.C. 154(b) by 606 days.

(21) Appl. No.: 13/381,204

(22) PCT Filed: Jul. 5, 2010

(86) PCT No.: PCT/JP2010/061399
§ 371 (c)(1),
(2), (4) Date: Mar. 23, 2012

(87) PCT Pub. No.: WO2011/002098
PCT Pub. Date: Jan. 6, 2011

(65) Prior Publication Data
US 2012/0176136 A1 Jul. 12, 2012

(30) Foreign Application Priority Data

Jul. 3, 2009 (JP) ................................. 2009-158687

(51) Int. Cl.
*G01V 3/00* (2006.01)
*G01R 33/3875* (2006.01)
(Continued)

(52) U.S. Cl.
CPC ........ *G01R 33/3875* (2013.01); *G01R 33/3815* (2013.01); *G01R 33/389* (2013.01)

(58) Field of Classification Search
CPC .................................................... G01R 33/389
USPC ................. 324/319, 318, 322, 300
See application file for complete search history.

(56) References Cited

U.S. PATENT DOCUMENTS 4,899,110 A   2/1990  Furukawa
4,931,733 A *  6/1990  Hanawa ........................ 324/318

(Continued)

FOREIGN PATENT DOCUMENTS

JP     2002-165772     6/2002

OTHER PUBLICATIONS

International Search Report issued Oct. 5, 2010 in corresponding International Application No. PCT/JP2010/061399.
(Continued)

*Primary Examiner* — Louis Arana
(74) *Attorney, Agent, or Firm* — Wenderoth, Lind & Ponack, L.L.P.

(57) ABSTRACT

A shimming device sequentially records a history of conducted shim setting, momentarily dynamically calculates compensation values corresponding to the record by the aid of a characteristic function, and dynamically controls the shim coil by the aid of the compensation values thus obtained, to thereby compensate magnetic field fluctuation of a superconducting magnet which is attributable to the setting of the shim, and stabilizes the magnetic field in an NMR superconducting magnet. This device includes a shim setting recorder (230) that records a set value of the shim, a type of set operation, the operation amount of the setting, and a time at which the setting is conducted, in association with each other for each setting; generating compensation function supply (210) that supplies a generating compensation function that is a function having the type of the operation, the operation amount, and the amount of time as factors, and is set so as to approximately compensate a magnetic field fluctuation attributable to individual setting; compensation value computer (240) that refers to the generating compensation function supply (210) and the shim setting recorder (230), computes a compensation value at the time t by the aid of a compensation function that is configured by, and outputs the computation result; a shim coil driver (300) that drives the shim coil (400) by the aid of a sum of the compensation value obtained by the compensation value computer (240), and a latest set value.

2 Claims, 8 Drawing Sheets

(51) Int. Cl.
   *G01R 33/3815*   (2006.01)
   *G01R 33/389*    (2006.01)

(56)            References Cited

U.S. PATENT DOCUMENTS 5,006,804  A  *   4/1991  Dorri et al. .................... 324/320
   5,345,178  A  *   9/1994  Manabe et al. ............... 324/320
   5,373,239  A  *  12/1994  Marek et al. .................. 324/320
   7,605,589  B2 *  10/2009  Weiger et al. ................. 324/320
   2002/0089328 A1   7/2002  Goto

OTHER PUBLICATIONS

European Search Report issued Jan. 14, 2014 in corresponding European Patent Application No. 10794266.6.

* cited by examiner

SHIMMING DEVICE FOR SUPERCONDUCTING MAGNET

TECHNICAL FIELD

The present invention relates to a technology for obtaining a magnetic field space large in homogeneity and high in stability, which is required when measuring a nuclear magnetic resonance (NMR) with high precision in a magnetic field of a superconducting magnet.

BACKGROUND ART

The superconducting magnet has been generally known as a magnet that can generate a homogenous and stable magnetic field (magnetostatic field). However, the homogeneity and stability of the magnetic field do not satisfy the precision required for high-resolution NMR measurement with no change. As known in Non-Patent Document 1, in the high-resolution NMR measurement, there is required that a turbulence of the magnetostatic field is 0.01 ppm or lower within a space of 1 $cm^3$ as a typical example, although depending on a need for measurement precision. Also, there is required that a change in the magnetostatic field with time is 0.01 ppm or lower per one hour. As a unit representative of a magnitude of the magnetic field, a ratio (ppm=1/1000000) of that magnitude to a magnitude of the magnetostatic field developed by the superconducting magnet is frequently used.

For that reason, in the superconducting magnet for the NMR, as known in Patent Document 1, the magnetic field intensity and the magnetic field homogeneity are corrected by the aid of a shim coil integral with the superconducting magnet. Setting its operating conditions to the shim coil is called "setting of the shim", and various parameters set in the shim are called "terms of the shim". The terms of the shim includes a Z0 (correction of a magnetic field value in parallel to a magnetostatic field), a Z1 (linear function correction of a magnetic gradient in parallel to the magnetostatic field), an X1 (linear function correction of the magnetic gradient in a direction perpendicular to the magnetostatic field), and a Y1 (linear function correction of the magnetic gradient in a direction perpendicular to the magnetostatic field and the X1) in correspondence with the magnetic field value to be corrected, a direction of the magnetic gradient, or a function form. That is, the term of the shim represents the correction magnetic field in a measurement space by its direction (X, Y, Z, XZ, YZ, . . . ), and the order (0, 1, 2, . . . ) of approximate in that direction.

The number and type of terms of the settable shim are determined depending on a device to be used. Also, in general, the set value of the shim means an array (Z0, Z1, Z2, Z3, X1, Y1, XZ, YZ, . . . ) in which the terms of the settable shim are combined together.

In this way, in the superconducting magnet for the NMR, an absolute value (term of zero order) of the magnetic field and various unhomogeneity (term of first order or higher) are generally corrected by the aid of the shim coil. To control the stability and homogeneity of the magnetic field by the shim coil is called "shimming".

The magnetic field formed by the shim coil interacts with a superconducting coil, and the magnetic field in the measurement space intricately fluctuates depending on time in correspondence with a history of values of the magnetic field generated by the shim coil. For example, when the set value of the shim is changed with a change in a probe, a long time of one week or longer may be required until the magnetic field of the superconducting magnet is stabilized.

This phenomenon is remarkably observed in the superconducting magnets for a high-field NMR, particularly, the superconducting magnet for a solid-state NMR (1H-930 MHz=21.8T) that generates the world-class magnetic field which is developed and used by us among those superconducting magnets, and adversely affects the NMR measurement. FIG. 1 illustrates results obtained by measuring, by the NMR, a change in the magnetic field in the magnetic field space with time when a step functional set value is set to the term of the Z0 of the shim at a time (t1), and a square wave value is set thereto at a time (t2) in fact in the superconducting magnet. In the figure, a solid line represents a measured value, the axis of ordinate represents a value of the magnetic field, and the axis of abscissa represents time. The figure shows an appearance that the values of the magnetic field to be originally horizontal between the times (t1) and (t2) largely fluctuate depending on time.

In the NMR measurement, since the probe is changed for each of measurement nuclides, the set value of the shim is also intermittently changed together with that change-state. The change in the probe is frequently conducted, particularly, in the solid-state NMR measurement. That is, there frequently occurs a situation in which new setting is conducted on the shim before a previous magnetic field fluctuation is reduced and disappears, and the magnetic field fluctuation associated with this new setting is overlapped on the previous magnetic field fluctuation.

It is assumed that a principle for generating the magnetic field fluctuation occurs because it takes time for a magnetic flux generated by the shim coil to migrate within the superconductor of the magnet while repeating pinning operation and hopping operation. When a non-equilibrium state of the distribution of the magnetic flux is reduced into an equilibrium state, the migration of the magnetic flux is terminated, and the magnetic field is stabilized. The magnitude of this effect depends on the property of the superconductor used, and is more remarkable as the magnetic field of the magnet is stronger. However, in principle, it is conceivable that the same effects occur to various degrees in the superconducting magnet that generates the intense magnetic field by the aid of type II superconductor. It is expected that a countermeasure against this phenomenon becomes an essential technology as the magnetic field of the NMR becomes further stronger.

In a solution NMR measurement in which a measurement target is a solution sample, there is generally used a technique called "NMR magnetic field lock" in which deuterated solvent such as deuterated chloroform is used as solvent, and setting of the shim is controlled by the aid of the NMR signal of deuterium, and the above magnetic field fluctuation can be compensated. However, in a solid-state NMR measurement in which a measurement target is solid, this technique is not used because the sample contains no solvent. In this way, the present invention is mainly intended for the superconducting magnet used for the solid high-resolution NMR measurement. Even in the solution NMR measurement, the present invention and the NMR magnetic field lock are used together whereby a load on an NMR magnetic field lock function is reduced, and higher-precision measurement is realized. Also, as compensation of the terms other than the Z0, the present invention provides the most effective compensating means.

In the present specification, the contents of the present invention are mainly described in line with the solid high-resolution NMR measurement, but the application of the present invention is not limited to this case.

The present invention can be applied to a system that enables shimming using the shim coil for a purpose requiring stabilization of the magnetic field of the superconducting magnet, as represented by a magnetic resonance imaging (MRI). In the MRI, various magnetic field modulations are conducted by a modulation coil, and an influence of application of the modulated magnetic field of various arbitrary waveforms on the superconducting magnet can be compensated by the present invention.

Also, in the solution NMR measurement, when an experiment (gradient shim method) in which a gradient magnetic field is applied by the aid of a gradient magnetic field shim coil is conducted, an influence of the application of the intermittent gradient magnetic field on the superconducting magnet can be compensated by application of the present invention.

DISCLOSURE OF THE INVENTION

Object of the Invention

The present invention has been made in view of the above circumstances, and therefore aims at compensating a magnetic field fluctuation caused by mutual interaction between a superconducting coil and a shim coil, and stabilizing a magnetic field in a measurement space in a high-field superconducting magnet.

Means to Solve Problem

The present invention provides a shimming method and a shimming device, which sequentially record a history of conducted shim setting, momentarily dynamically calculate compensation values corresponding to the record by the aid of a characteristic function, and dynamically control the shim coil by the aid of the compensation values thus obtained, to thereby compensate the magnetic field fluctuation of the superconducting magnet which is attributable to the setting of the shim, and stabilize the magnetic field, in an NMR superconducting magnet. The shimming method and the shimming device are generically named "shimming system".

The setting of the shim is to give a new set value to be set to the shim. When the setting of the shim is conducted, the setting of the shim transits from a start state to an end state assuming that a state before the setting of the shim is conducted is the start state, and a state based on the setting newly conducted is the end state. In a process of transition from the start state to the end state, a curve of an arbitrary waveform connecting the start state and the end state along a time axis is allowed. A form or a qualitative aspect of the waveform connecting the start state and the end state is characterized by the type of operation of the shim setting.

The simplest type of the shim setting operation is a step function linearly connecting the start state and the end state in an infinitely small time. Depending on the type of operation, the transition process may have a meaning even if the start state and the end state are the same. The quantitative aspect of the transition process is characterized by the amount of operation of the setting. When the type of operation is the step function, the amount of operation of the setting is equal to a difference in level of the steps, that is, a difference between the start state and the end state. When the type of operation is a square wave, the amount of operation of the setting is represented by a height of the square wave and a width on the time axis. In this way, the amount of operation of the setting is not limited to a scalar quantity, but is generally a vector quantity, and expressed by an array.

The conducted shim setting is characterized by a set value of the shim, the type of operation thereof, and the amount of operation thereof. That is, in the present invention, to sequentially record the history of the conducted shim setting means to record the set value of the conducted shim setting, the type of operation thereof, and the amount of operation thereof in association with times at which they are conducted. The time means an absolute value of a time determined according to an appropriate definition on the time axis, and can comply with a general calendar from a viewpoint of the utility. An origin of the time may be arbitrarily determined. Also, in general, a difference between one time and another time is represented by the amount of time, and the amount of time from the origin of the time is represented by the time. In the present specification, the time and the amount of time are distinguished according to whether symbol "'" is added, or not, so that the time is t, and the amount of time is t'. However, if a physical interruption is not incorrect, distinction therebetween is not always essential.

According to the first invention, there is provided a shimming device that compensates stability and homogeneity of a magnetic field of a superconducting magnet with a shim coil, in which at least one term of the shim is controlled by the following means (1) to (4).

(1) shim setting recording means that records, when the setting of the shim is conducted, a set value u of the shim, a type w of set operation, operation amount s of setting, and the time t of setting, by associating the setting finally conducted with an index N−1 so as to be referred to as $(w_n, u_n, s_n, t_n)$ by the aid of an index n which is a value of 0 to N−1 where the number of times of setting is N;

(2) generating compensation function supply means that supplies a generating compensation function "$f^w(s,t')$" that is a function having the type w of the operation, the operation amount s, and the amount of time t' as factors, which has a property to become 0 when the amount of time t' is infinite, and is set so as to approximately compensate a magnetic field fluctuation attributable to individual setting;

(3) compensation value calculating means that calculates a compensation value at the time t by the aid of a compensation function assuming that symbol "Σ" represents a sum of n (0, 1, 2, . . . N−1), and the compensation function "$g(t)$" is a function of the time t which is expressed as "$g(t)=\Sigma f^{w_n}(s_n, t-t_n)$" by the generating compensation function and the setting of the shim conducted before the time t; and (4) shim coil driving means that drives the shim coil by the aid of a sum of the compensation value obtained by the compensation value calculating means, and a latest set value $u_{N-1}$.

According to the second invention, in the shimming device of the first invention, the generating compensation function is expressed as "$f^w{}_{s=s_0}(t') \times h(s/s_0)$" assuming that the generating compensation function "$f^w(s_0, t')$" when the operation amount s of setting has a specific value $s_0$ is a species compensation function "$f^w{}_{s=s_0}(t')$" which is a function of the amount of time t', the operation amount s of setting is normalized by the aid of $s_0$, and a polynomial function h of the normalized operation amount "$s/s_0$" is $h(s/s_0)$.

According to the third invention, there is provided an NMR probe device used for experimentally obtaining the generating compensation function in the shimming device according to the first invention or the second invention, in which the NMR probe device includes at least two NMR probe elements, each of the NMR probe elements contains a standard sample for magnetic field intensity measurement therein, and the NMR probe elements are set at given discrete positions in a measurement space.

Effects of the Invention

The shimming device according to the first invention realizes the following method, and in at least one term of the shim, the set value of the shim is subjected to compensation depending on time by the means configured by the following components (1) to (4).

(1) When the setting of the shim is conducted, the number of times N of conducted setting, the set value u (generally, a real number) of the shim, the type w (generally, set) of operation thereof, the operation amount s thereof (generally, array having elements of real numbers), and the time t (generally, a real number) at that time are sequentially recorded. It is desirable that those values are generally recorded as the array ($u_n$, $w_n$, $s_n$, $t_n$). Here, n is an index of an integer for distinguishing the individual setting, and a range of n is (0, 1, 2, . . . N−1). In this case, the latest record is designated by an index N−1.

(2) The generating compensation function $f^w(s, t')$ is a function of the type w, the operation amount s, and the amount of time t' (generally, a real number), and obtained and set in advance as a function representing the compensation amount (generally, real number) for individual setting. The generating compensation function f is a function having a property to become 0 when t' is infinite.

(3) The compensation value (generally, a real number) at the time t is calculated by the aid of the compensation function $g(t)=\Sigma f^{wn}(s_n, t-t_n)$ which is a function of the time t. Symbol $\Sigma$ represents a sum of n (0, 1, 2, . . . N−1). The compensation function g(t) is expressed by the generating compensation function f and the record ($w_n$, $s_n$, $t_n$) f the shim setting. The compensation value at the time t is momentarily obtained by substituting the time t into the compensation function g(t).

(4) The compensated value u' (generally, a real number) is obtained as a sum of the latest set value and the compensation value by Expression "$u'=u_{N-1}+g(t)$". The shim coil is driven by using the compensated value u'.

In most of the general NMR measurement, the setting of the shim is used solely for adjusting the absolute value and the homogeneity of the magnetic field. In this case, it is significant that the setting of the shim designates the end state, and as the type w of operation of the setting, the step function is used.

On the other hand, when the gradient magnetic field method is used in the NMR measurement, or the MRI measurement is conducted, it is significant that the magnetic field modulation is applied to the sample by the magnetic field modulation coil. The modulation coil functionally belongs to one type of the shim coils. That is, the application of the magnetic field modulation is one configuration of the setting of the shim, and in the present specification, the setting of the shim includes the magnetic field modulation. In this case, generally, the start state and the end state of the setting of the shim are identical with each other, and a waveform of the transition process is significant. The shape and magnitude of the modulated magnetic field can be designated by the type w and the operation amount s of the setting.

It is needless to say that the present invention can be applied to a case in which both of the end state of the shim setting and the transition process are significant.

In this way, in the present invention, the generating compensation function f has the type w of operation of the shim setting as an argument so as to cope with various intended purposes.

If the type of operation of the shim setting is limited to one, for example, if the setting to be conducted is entirely determined as the step function, a dedicated type of operation of the generating compensation function f needs to be prepared, and the record and designation of the type w of operation may be omitted.

According to the second invention, in the shimming device of the first invention, a shimming method in which the generating compensation function and the compensation function are represented by the following respective expressions is implemented.

Generating compensation function=$f(s,t')=f_{s=s0}(t')\times h(s/s_0)$

Compensation function=$g(t)=\Sigma f(s_n, t-t_n)$ (where symbol $\Sigma$ represents a sum of n (0, 1, 2, . . . N−1)). where Auxiliary function 1=$h(x)=(\Sigma A_k \times x^k) \times h'(x)$ (where symbol $\Sigma$ represents a sum of k)

Auxiliary function 2=$h'(x)=((\alpha \times \exp(\beta \times x)-(2-\alpha) \times \exp(-\beta \times x))/(\exp(\beta \times x)+\exp(-\beta \times x)))$ Symbol $s_0$ is a constant used for normalization.

$A_k$, $\alpha$, and $\beta$ represent respective appropriate constants (fitting parameters) for approximation.

This method (second invention) assumes that the operation amount s is a scalar quantity as represented by a case in which the type of operation of the shim setting is the step function. Since the operation amount s is generally an array, when this method is applied, it is an unspoken understanding to use this method after the array s is converted into the scalar quantity s'. When the type of operation of the shim setting is the step function, since the number of elements of the operation amount s is one, the operation amount s corresponds to the scalar quantity s' as it is. Also, for example, when the type of operation is a square wave, the elements of s are two elements of a height h and a width dt. Therefore, with the use of those elements, an area s' obtained as s'=h×dt can be used as the scalar quantity.

In this method (second invention), since the generating compensation function is normalized and obtained by a specific operation amount $s_0$, the generating compensation function can be easily obtained. Also, since the function form is simplified, there is advantage in that the amount of calculation when calculating the compensation value is reduced.

Since the compensation function is indicated by series expansion of the operation amount s on the basis of the generating compensation function, the continuity of the compensation value is automatically ensured. Also, the compensation value can be easily calculated by the small amount of calculation.

In particular, if the compensation function is a function that is represented by the series expansion of a relatively low order, and monotonous with respect to the factor, there is no concern that a guaranteed value has an unexpected value with respect to a wide-range input, and a risk that an error occurs in the setting of a guaranteed function to cause a significant failure is removed. That is, wide-area operation can be guaranteed by a small number of operation tests.

A main portion of the shimming device according to the first and second inventions is installed within a shim coil control device. The following respective means is installed in the shim coil control device, and the above shimming method is realized in cooperation with those respective means.

That is, the above respective means includes setting receiving means for receiving shim setting, recording means for sequentially recording a history of the setting of the shim, generating compensation function supply means for supplying a predetermined generating compensation function, compensation value calculating means for calculating a compensation value on the basis of the time and the recorded history of the setting of the shim, output value computing means for adding the set value of the shim to the compensation value, and output outgoing means for outputting the computation result to an external.

According to the third invention, there is provided the NMR probe device used to obtain the generating compensation function in the shimming device according to the first and second invention, and with the use of this device, the generating compensation function for the terms other than the Z0 can be also easily obtained. Each of at least two, desirably seven or more of the plural NMR probe elements includes an NMR measurement coil and a standard sample included therein, and those NMR probe elements are set at given spatially discrete positions, independently. A change of the magnetic field intensity with time at a different place within the measurement space can be measured.

With the use of the shimming device according to the first and second inventions, in the NMR measurement using the high-field superconducting magnet, the magnetic field fluctuation before and after the probe change or the shim value adjustment is eliminated to obtain an excellent measurement precision.

Also, with the use of the NMR probe device according to the third invention, the correction generating function for the terms other than the Z0 can be efficiently obtained.

Figure 1:
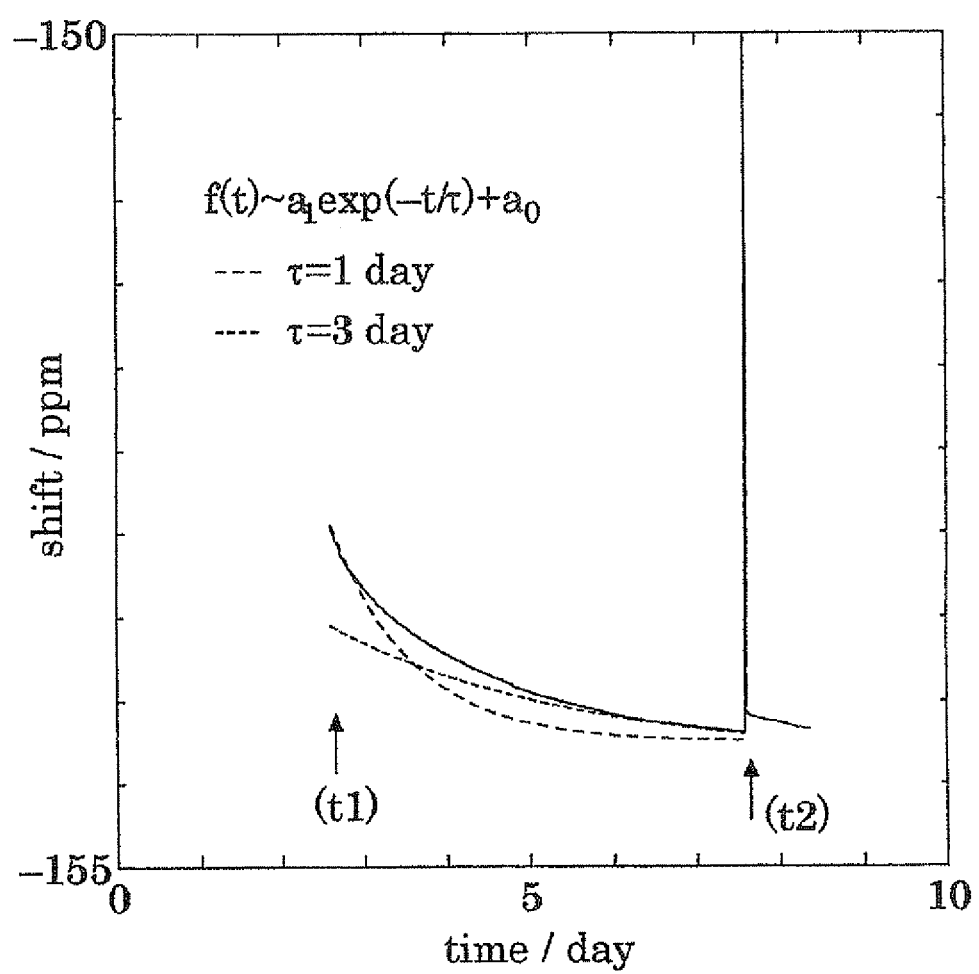
FIG. 1 is a graph illustrating a measured value and approximate curves of a magnetic field fluctuation of a superconducting magnet.

Symbols in the figures represent the following elements.
(t1), (t2), (t3): times
(E1): curve of magnetic field
(C1), (C2): approximate curve
(ES): measurement space
(ROO), (RX−), (RX+), (RY−), (RY+), (RZ−), (RZ+): measurement coil
(LX), (LY), (LZ): distance between measurement coils
X: X-axis
Y: Y-axis
Z: Z-axis
(100): total control computer
(200): shim coil control device
(210): generating compensation function supply means
(220): shim setting receiving means
(230): shim setting recording means
(240): compensation value computing means
(250): output value computing means
(260): synchronization signal generating means
(270): post-compensation setting output means
(300): shim coil driving device
(400): shim coil
(500): high-resolution NMR superconducting magnet device
(510): superconducting magnet
(600): NMR probe device
(610), (610b): cylindrical housing
(620): flange
(630), (630b): resonator mounting
(640): measurement coil
(650): tuning circuit
(700): NMR spectrometer
(800): NMR probe element
(810): measurement coil
(820): standard sample
(830): tuning capacitor
(840): matching capacitor
(850): coaxial cable

MODES FOR CARRYING OUT THE INVENTION

The present invention can be implemented by an electronic computer (computer), a series of computer control codes (program) that controls the operation of the computer, a shim coil driving device that operates through a communication with the computer, and a shim coil that is driven by the shim coil driving device. The computer doubles as a computer for control of the NMR measurement, and a necessary program is set up in the computer so as to enable the computer to operate in parallel to the NMR measurement at the same time. Also, the computer is set for each of functional parts, and the functions can be dispersed to enhance a fault tolerance and a throughput.

In the present specification, a device that outputs a signal for controlling the shim coil, which is a set including the computer into which the program is installed, a combination thereof, and a peripheral device having a share of that function is called "shim coil control device". Also, a device that controls the stability and the homogeneity of the magnetic field by the shim coil, which is a set including the shim coil control device, the shim coil driving device, and the shim coil, is called "shimming device".

The shim coil driving device has inputs corresponding to the respective terms of the shim, conducts conversion so as to generate the magnetic field corresponding to the input, and outputs a current to each specific coil within the shim coil. The shim coil includes various coil elements wound in diverse directions. A conversion expression is generally represented by a tensor. The tensor depends on specific setting of each coil element in the shim coil, and set as the conversion expression inherent to the device within the shim coil driving device in advance. Also, not only the conversion expression but also a specification of wire connection between the shim coil and the shim coil driving device are not generally published, and therefore the shim coil and the shim coil driving device are virtually dealt with as being inextricably linked.

In many cases, the shim coil driving device and the shim coil control device are connected to each other by a digital line. When the shim coil driving device and the shim coil control device are connected by the digital line, the shim coil driving device can be so set as to react with only reception of an output from the shim coil control device. Therefore, the system can be configured so that malfunction is voided even if the shim coil control device is temporarily separated.

A communication procedure between the shim coil control device and the shim coil driving device is not generally published, and the commonalities therebetween are not secured. Therefore, the shim coil driving device and the shim coil control device are virtually inextricably linked.

In implementation of the present invention, a variety of known techniques and existing devices can be employed in the shim coil and the shim coil driving device. However, for the above reasons, the shim coil and the shim coil driving device are inextricably linked in implementation of the present invention, and therefore, the shimming device according to the present invention is realized with the inclusion of the shim coil and the shim coil driving device.

The fluctuation corresponding to the term of the Z0 most affects precision in the NMR measurement. Therefore, in many cases, the present invention is applied to the Z0, thereby improving the measurement precision to obtain a satisfactory result. When more precise compensation is required, the present invention is desirably applied to the terms sequentially in ascending order (Z1, X1, Y1, XZ, YZ, Z2, X2, Y2 . . . ).

When the terms to which the present invention is applied are limited, it is desirable to take the probe device to be used and the symmetry of the sample into account. For example, when a magic angle spinning (MAS) probe device is used in solid-state NMR measurement, a direction along which the MAS probe device is installed is set so that, for example, an x-axis between the x-axis and a y-axis of the shim coil, and an MAS sample tube are substantially parallel to each other, to thereby enable an influence of the fluctuation in the y-direction to be reduced. Therefore, in the terms other than the Z0, it is desirable that the present invention is applied to Z1, X1, and XZ in the stated order. In this case, if the present invention is applied to those four terms, it is expected to obtain a sufficiently satisfactory result.

In this way, it is preferable to set the number of terms (the number of channels) to which the present invention is applied according to a need for the probe device to be used and the required measurement precision.

The magnetic field in a sample space is composition of a magnetic field generated by the superconducting magnet and a magnetic field generated by the shim coil. For example, when attention is paid to the term of the Z0 of the shim, the magnetic field of the superconducting magnet corresponding to this term is a magnetostatic field $B_0$. In this case, a magnetic field B in the sample space becomes a sum of the magnetic field $B_0$ generated by the superconducting magnet and a magnetic field $u^{z0}$ generated by the shim coil. That is, "$B=B_0+u^{z0}$" is met.

In the terms other than the Z0 of the shim, an unhomogeneous component of the magnetic field corresponding to a term C (C=Z1, X1, Y1 . . . ) of the shim is described as "$B_{//c}$". Also, a magnetic field component corresponding to the term C of the shim derived from the superconducting magnet is described as "$B_{0//c}$", and a magnetic field component corresponding to the term C of the shim which is developed by the shim coil is described as "$u^c$". That is, the components of the magnetic field in the respective directions in the sample space are described as "$B_{//c}=B_{0//c}+u^c$" (C=Z1, X1, Y1 . . . ). For example, the component of the magnet field along the term of X1 of the shim is described as "$B_{//x1}$", and its value is described as "$B_{0//x1}+u^{x1}$". Thus, the magnetic field components can be resolved into the magnetic field component derived from the superconducting magnet and the magnetic field component derived from the shim coil for description.

Further, $B_{//z0}=B$ and $B_{0//z0}=B_0$ are defined. As a result, the respective components of the magnetic field in the sample space are uniformly described as "$B_{//c}=B_{0//c}+u^c$" (C=Z0, Z1, X1, Y1 . . . ).

When discussion is focused on one arbitrary term of the shim, the set value $u^c$ of the shim may be described merely as "u" with the omission of C which is an arbitrary index.

In the following description, if not particularly described, attention is paid to one term of the shim in the description. The Z0 and the other terms (Z1, X1, Y1, . . . ) are different in only the configuration of an appropriate measurement device when obtaining the generating correction function, and the present invention can be similarly applied to the other configurations thereof in principle.

Hereinafter, a description will be given in more detail of the contents of the present invention with reference to the illustrations of specific embodiments.

First Embodiment

Figure 2:
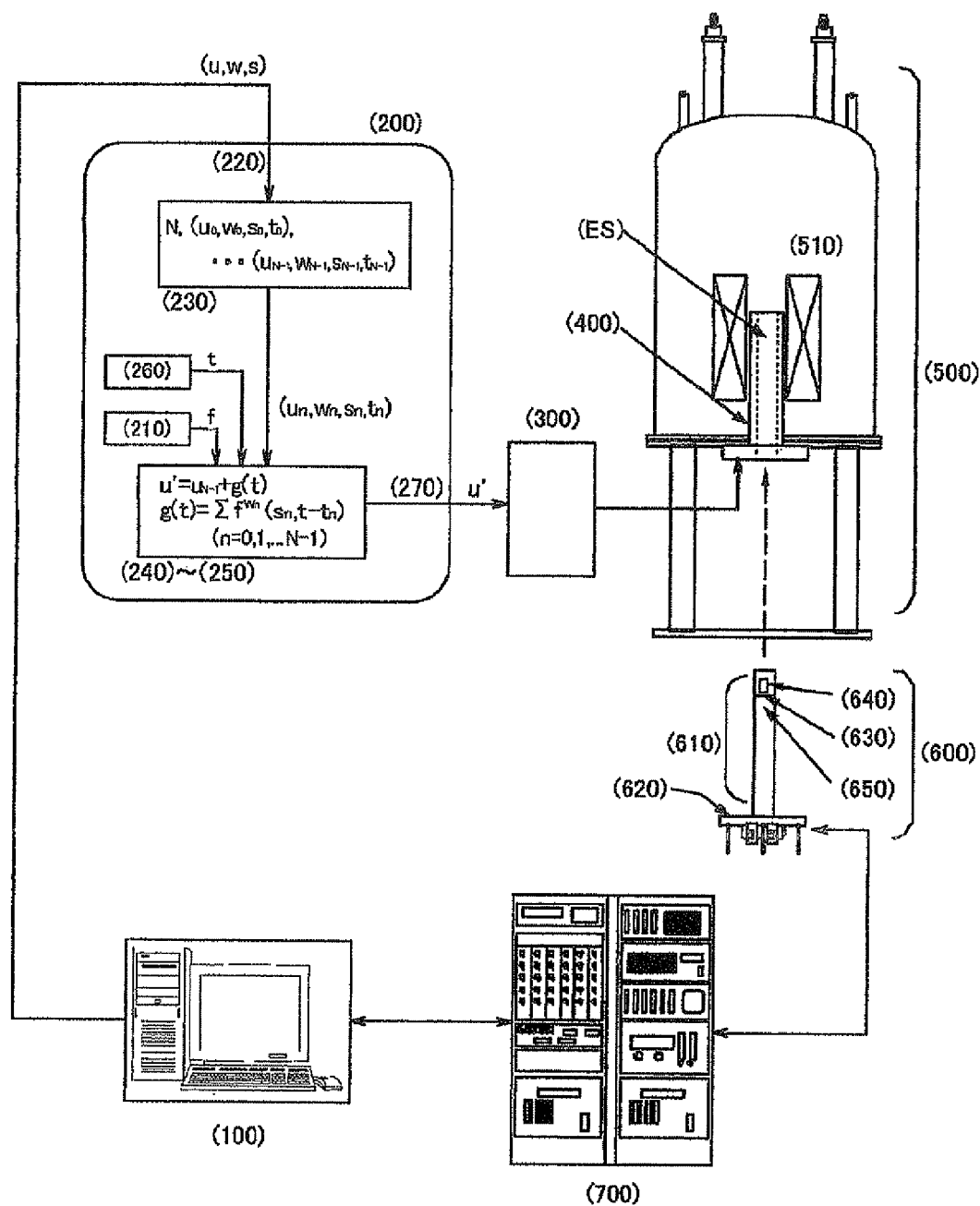
FIG. 2 is a block diagram illustrating a system configuration according to a first embodiment.
Figure 3:
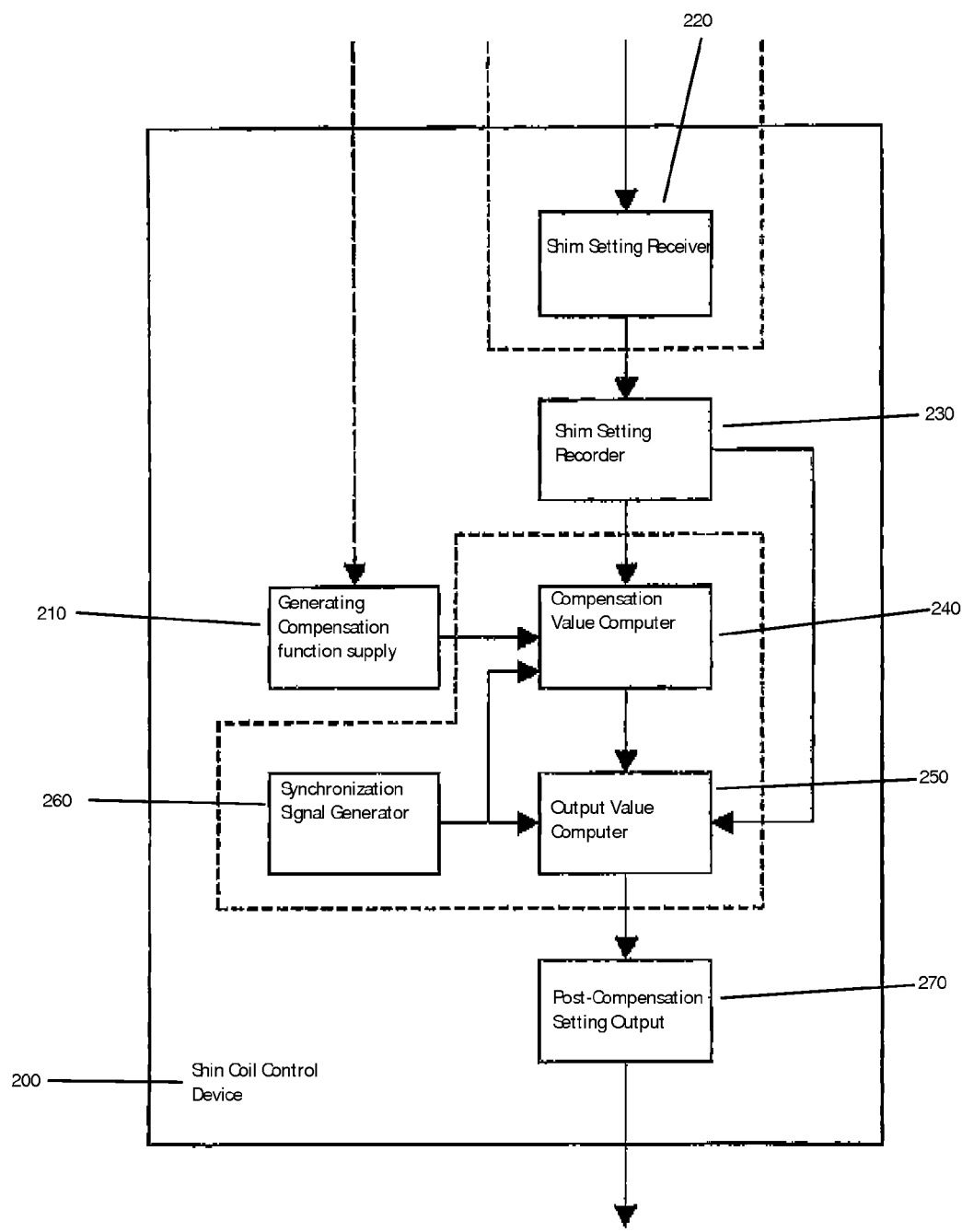
FIG. 3 is a block diagram illustrating an internal configuration of a shim coil control device.

First, a specific device configuration according to this embodiment will be described with reference to FIGS. 2 and 3. FIG. 2 is a block diagram illustrating an overall system, and FIG. 3 is a block diagram of the interior of the shim coil control device.

A total control computer (100) comprehensively manages any control related to NMR measurement including an NMR measurement device and shim coil control. The total control computer (100) receives setting of a shim from an experimenter, and sets a set value of the given shim in a shim coil control device (200). The setting of the shim may be given by a computer program instead of the experimenter. For example, in replacement of a probe, the setting of the shim is given an initial setting by a setting file prepared for each probe in advance.

The shim coil control device (200) takes a core role in the compensation of a shim value in a shimming system according to the present invention. The shim coil control device (200) receives setting (u, w, s) of the shim from the total control computer (100), subjects the setting to given compensation, and outputs compensated setting (u') of the shim to a shim coil driving device (300). The amount of compensation to be conducted is changed as a function of time. The shim coil control device (200) is connected to the total control computer (100) and the shim coil driving device (300) by a digital communication line.

The following respective means are installed within the shim coil control device (200), and those respective means operate in cooperation with each other to conduct given operation as a while.

Shim setting receiving means (220) shim setting receiver receives the setting (u, w, s) of the shim from the total control computer (100) through the digital communication line, and delivers the setting to shim setting recording means (230).

The shim setting recording means (230) shim setting receiver receives the setting of the shim from the shim setting receiving means (220). The number of times of the received setting of the shim is recorded in a variable N. The received setting of the shim is recorded as $(u_{N-1}, w_{N-1}, s_{N-1}, t_{N-1})$ in association with a time $t_{N-1}$ of that time. The recorded setting $(u_n, w_n, s_n, t_n)$ (n=0, 1, 2, . . . N−1) of the shim and the number of times N of conducted setting can be referred to from other means.

Generating compensation function supply means (210) supplies diverse predetermined generating compensation functions on demand. The generating compensation function is a function of a type w, an operation amount s, and the amount of time t', which is so set as to approximately compensate a magnetic field fluctuation attributable to individual setting. The generating compensation function is inherent to the device to be used, and preset from the external prior to the use of the device (dotted line in FIG. 3). A framework of a function form is described (hard-coded) in a program fashion, and the setting of partial parameters is read from the setting file.

Compensation value computing means (240) compensation value computer refers to the generating compensation function supply means (210) generating compensation function supply and the shim setting recording means (230), computes a compensation value at the time t with the use of a compensation function configured by them, and outputs a computation result. A compensation function "g(t)" is a function of the time t which is expressed as "g(t)=Σf'''($s_n$, t−$t_n$)" by the generating compensation function and the setting of the shim conducted before the time t. Symbol "Σ" represents a sum of n (0, 1, 2, . . . N−1).

Output value computing means (250) output value computer adds an output of the compensation value computing means (240) to the set value of the shim obtained with reference to the shim setting recording means (230), and outputs the added set value. A compensated set value u' can be obtained by using a formula "u'=$u_{N-1}$+g(t)".

Synchronization signal generating means (260) synchronization signal generator outputs time information at substantially constant time intervals. A computation frequency of the compensation value is rate-controlled according to the output frequency.

Post-compensation setting output (270) receives the shim setting u' that has been subjected to compensation from the output value computing means (250), and delivers the shim setting u' to the shim coil driving device (300) through the digital communication line.

Referring to FIG. 3, a flow of information is indicated by arrows, and the strength of connection of the respective means is indicated by enclosures of dotted lines. For example, the shim setting receiving means (220) has a property to operate in synchronism with an external signal since the shim setting receiving means (220) is a part that waits for and receives the setting from the total control computer (100).

The generating compensation function supply means (210) receives the setting from the external only if the setting is an initial setting at the time of updating the system or the like (a route indicated by a dashed arrow in FIG. 3).

Since the compensation value computing means (240) is rate-controlled by the synchronization signal generating means (260), as a result of which the output value computing means (250) outputs the compensated setting in synchronism with those means.

The shim coil driving device (300) drives a shim coil (400) according to the set value received from the shim coil control device (200). The shim coil (400) is set integrally with a superconducting magnet (510) to form a high-resolution NMR superconducting magnet device (500) as a whole. The measurement space (ES) is set near the center of the magnetic field thereof.

The high-resolution NMR superconducting magnet device (500) can be equipped with an NMR probe device (600). The NMR probe device (600) externally includes a cylindrical housing (610) and a flange part (620), and is attached to the high-resolution NMR superconducting magnet device (500) by the flange part (620). A resonator mounting (630) is disposed inside the cylindrical housing (610). Inside the cylindrical housing (610), a resonator is configured by a measurement coil (640) and a tuning circuit (650), which are supported by the resonator mounting (630). The measurement coil (640) is located in the center of the magnetic field within a measurement space (ES), and a sample to be measured is held within this coil so that the NMR measurement can be conducted.

An NMR spectrometer (700) is connected to the NMR probe device (600), irradiates a variety of measurement high frequency pulse trains, and receives an electromagnetic response signal to the irradiated pulse trains, thereby conducting the NMR measurement. A sequence of procedures such as the irradiation of the high-frequency pulse trains and the signal reception, which is conducted in the NMR measurement, is called "pulse sequence". The operation of the NMR spectrometer (700) is controlled by the total control computer (100).

The total control computer (100), the shim coil control device (200), the shim coil driving device (300), and the NMR spectrometer (700) autonomously operate while communicating closely with each other. Even if a communication failure occurs among those devices, the operation is continued to the extent possible.

Figure 4:
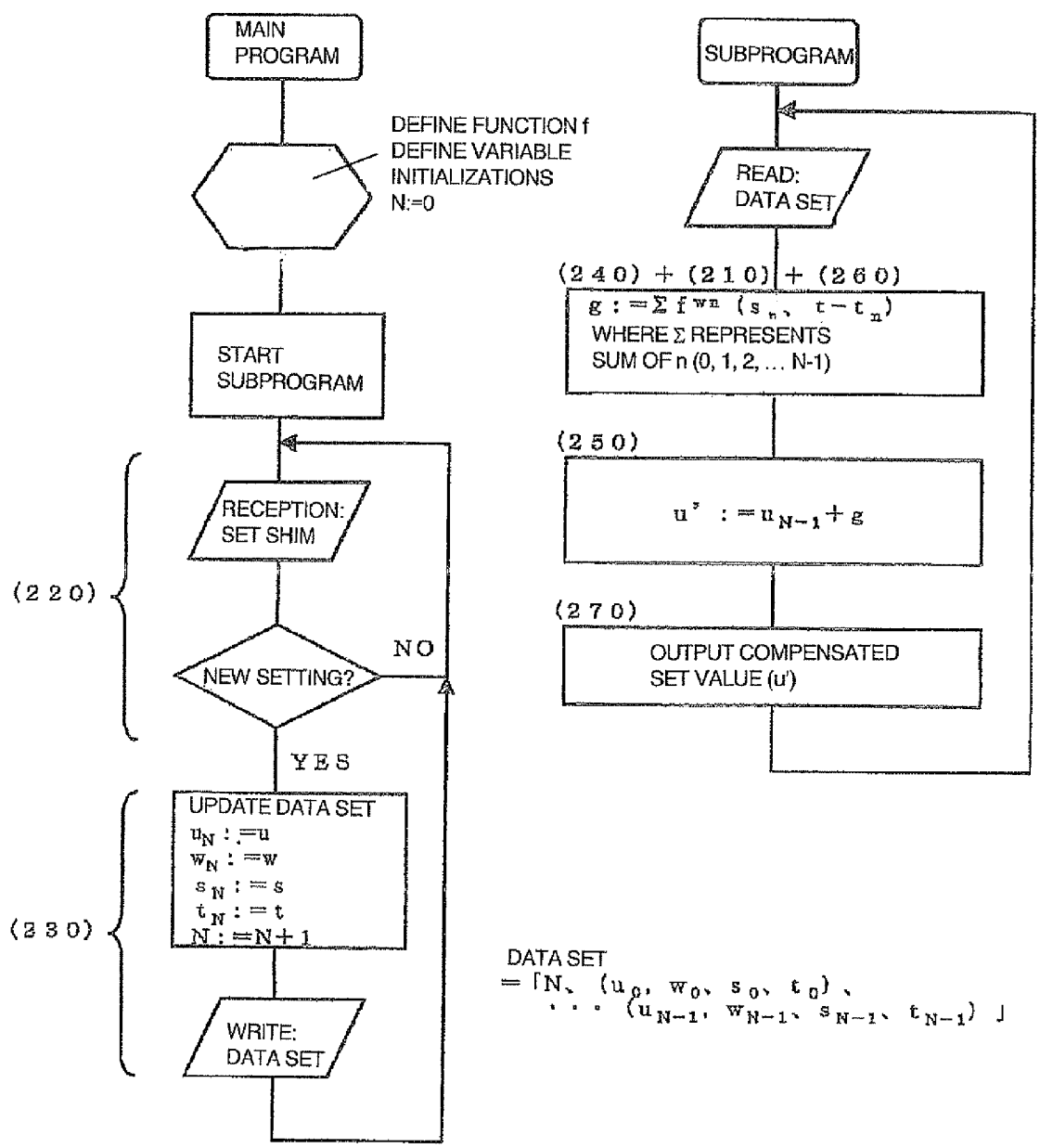
FIG. 4 is a flowchart illustrating the operation of the shim coil control device.

The respective means implemented within the shim coil control device (200) are realized in more detail by a program represented by a flowchart illustrated in FIG. 4. Reference numerals corresponding to those in FIG. 3 are added in association with the functions of the respective parts. As illustrated in FIG. 4, the main functions are realized by a loop within a main program for sequentially recording a change in the given set value of the shim, and a loop within a subprogram for autonomously sequentially outputting the compensation value. The main program and the subprogram share global variables, global constants, global functions, and time defined by the main program. The subprogram initially starts by the main program, and subsequently, operates out of synchronism with the main program. The output of the compensated setting u' is sequentially updated by the subprogram.

The subprogram can be loaded into the loop of the main program, and conduct synchronous operation. When the synchronous operation is conducted, there is advantage in that there is no need to confirm the synchronization at the time of reading or writing a shared variable, and an error hardly occurs in program creation. On the other hand, there is a possibility that a delay of the setting process extends over the output, and timing of the output is not stabilized. Therefore, the synchronous operation may be selected taking the above into account.

Although not particularly illustrated in FIG. 4, for the purpose of reducing a load on the device, the loop of the subprogram is executed at appropriate time intervals according to a synchronization signal supplied from the synchronization signal generating means (260).

Data such as the global variables, the global constants, or the global functions can be stored in not a volatile main storage such as a semiconductor storage, but a nonvolatile auxiliary storage such as a disc device or a semiconductor nonvolatile storage so as to be shared. In most of cases, this configuration is desirable. When data is stored in the nonvolatile auxiliary storage, even if the system is abruptly interrupted, the interruption can be restored without failure unless the shim coil driving device fails, or a system clock is remarkably wrong. It takes more time to refer to the auxiliary storage than the main storage, but there are frequently no large disadvantages. It is further desirable that storage of the information is appropriately multiplexed by using both of the main storage and the auxiliary storage to provide for the abrupt interruption of the system while ensuring a reference speed.

In this embodiment, those data is stored as a data file on a file system configured in a hard disc device so as to be shared, and the respective programs are synchronized with the data on the main storage by monitoring an update status of their files.

In this embodiment, in more detail, a data set including an integer variable N, and the array variable $(u_n, w_n, s_n, t_n)$ having (N−1) elements (n=0, 1, 2, ... N−1), which are the global variable, are shared between the main program and the subprogram with the data file as a medium.

The set value of the shim is set by the total control computer (100) with some means through the digital communication. In this embodiment, a part of the file system of the shim coil control computer (200) are shared on a computer network by the total control computer (100), and the set value of the shim is set by rewriting the data file set in a shared area. That is, in this embodiment, the setting of the shim is loaded into the program with the data file on the hard disc device as a medium.

A procedure of "compensated setting (u') output" in the subprogram is a procedure of setting a compensated set value u' of the shim by the aid of a given communication procedure for the shim coil driving device (300). With this procedure, the compensated set value of the shim is transmitted to the shim coil driving device (300), and the shim coil driving device (300) outputs a current converted according to each coil element in response to the compensated set value to drive the shim coil (400).

The generating compensation function $f^w(s, t')$ has a property to approach asymptotically to 0 as the amount of time t' becomes larger. Therefore, for example, when $t-t_0$ becomes sufficiently large with time, the contribution of $f^w(s_0, t-t_0)$ can be ignored. It is desirable that such old data is appropriately destroyed. In more detail, at a certain time t, when an absolute value of $f^w(s_0, t-t_0)$ becomes a certain reference value or lower, the subject data $(u_0, w_0, s_0, t_0)$ is destroyed, the subsequent data is sequentially moved up, and the index may be newly renumbered as N:=N−1, $(u_i, w_i, s_i, t_i):=(u_{i+1}, w_{i+1}, s_{i+1}, t_{i+1})$, and (i=0, 1, ... N−1). As a result, both of the amount of calculation for calculating the compensation value and a storage area for storing the variable can be saved.

It is desirable that timing of updating the compensation value is synchronized with the NMR measurement so as not to affect the measurement. In more detail, within the subprogram, a status of executing a pulse sequence of the NMR measurement is monitored, and when data collection for one measurement is completed, and the measurement enters a relaxation wait time, the compensation value may be updated. In this case, when a code for generating the synchronization signal representative of whether the compensation value is updated, or not, is explicitly set in the pulse sequence of the NMR measurement, and the shim coil control computer (200) monitors the synchronization signal, sure operation is further expected.

The generating compensation function $f^w(s, t')$ has three arguments of the type w (set), the operation amount s (array or a real number when the second invention is applied), and the amount of time t' (real number), and is defined within the program as a function that returns a value of the real number in advance. The set is a set of the types of the operation such as (step function, square wave, triangular wave, saw-tooth wave, ... ), and can be associated with subset (0, 1, 2, 3, ... ) of integers. The number of elements of the set is the number of types of the operation to be dealt with by the system. A part of the parameters that define the generating compensation function is set in such a way that it can be read from a definition file on the auxiliary storage. A specific expressing method of the generating compensation function f is not limited in principle, and in the respective types w, there can be used a function giving an appropriate approximate value that satisfies a relationship of "|set value of magnetic field $(=B_{0//c}+u^C)$—measured value of magnetic field $(=B_{//c})-$ $f(s_n, t'_n)$|<allowable error" for the set (n=0, 1, 2, ... ) of the sufficiently extensive and close operation amount and the amount of time $(s_n, t'_n)$. However, since the compensation value is frequently recalculated at each time t with the use of the generating compensation function, it should be noted that the amount of calculation is prevented from being too large.

Subsequently, a description will be given of a specific setting method of the generating compensation function $f^w(s, t')$ in this embodiment. In the following description, for facilitation of understanding, the type of operation is limited to the step function, and the generating compensation function in this case is described as $f^{w=0}(s, t')$. Further, a portion of "w=0" is omitted, the generating compensation function is also described as f(s, t'). When the type of operation is different, the portion of "w=0" may be replaced with another.

Also, hereinafter, the term of the shim will be described focusing on the term of the Z0 of the shim. When this is applied to another term of the shim, for example, since $B_0=B_{0//Z0}$ and $u=u^{Z0}$ are met in the following case, the portion of the Z0 may be read as a general term C (C=Z1, X1, Y1, ... ).

Since a spatial shape (function form) of the corrected magnetic field is different depending on the target term, the underlying data measuring method is different. Attention should be paid to this fact. For example, a value of the magnetic field means a magnetic field intensity when the target is the term of the Z0, and a magnetic gradient along the respective axes when the target is a first-order term (Z1, X1, Y1).

It is assumed that the setting of the shim including the set value $u_0$, the type $w_0=0$ (step function), and the operation amount $s_0$ of the shim is given at a time $t=t_0$. It is assumed that the measured value of the magnetic field B immediately before the time $t_0$ is $p_0$, and the measured value of the magnetic field B at the time t after the time $t_0$ is p(t).

Under the above definitions, the generating compensation function $f^{w=0}(s, t')$ is defined as an approximate function that satisfies a relationship of "$B_0+u_0=p(t)+f^{w=0}(s_0, t-t_0)$" within an acceptable error range. That is, when it is assumed that a magnitude of the acceptable error is e, an expression to be satisfied is "$|f^{w=0}(s_0, t-t_0)+p(t)-B_0-u_0|<e$" (Expression A).

With time, p(t) approaches asymptotically to a new set value $B_0+u_0$, and $f^{w=0}(s_0, t-t_0)$ approaches asymptotically to 0. It is assumed that the measures of the set value and the measured value are calibrated in advance so as to match each other within the acceptable error range. Since the generating compensation function $f^w(s, t')$ has a property to become 0 when t' is sufficiently large, even if the calibration is insufficient, the error is not accumulated.

All potentially given (s, t') of the generating compensation function $f^{w=0}(s, t')$ must be defined.

Since $f(s_n, t')$ for a specific $s_n$ (n=0, 1, 2, ... ) which is discretely provided can be obtained by measurement in a process of obtaining the generating compensation function, this is explicitly described as $f_{s=sn}(t')$. The function $f_{s=sn}(t')$ when s of the generating compensation function is thus fixed to a specific value $s_n$ is called "species compensation function". The species compensation function is a function of the amount of time t', and characterized by a subscript (s= ... ), and distinguished from each other.

The species compensation function may approach asymptotically to the measured value within an error range. As a specific function form, appropriate analytical functions may be combined together, or numerically defined non-analytical functions such as a piecewise linear function may be used. Also, it is desirable that their combinations may be appropriately changed by a domain to give consideration to a balance of the error and the amount of calculation.

If s=0 is set, $f_{s=0}(t')=0$ is obtained as an obvious function. Also, if s=±$s_0$ is set, $f_{s=-s0}(t')=-f_{s=s0}(t')$ is generally expected from a symmetry of the system. In the term related to the Z-axis such as the Z0, the positive and negative of sign correspond to parallel and nonparallel to a large magnetostatic field, and a difference occurs between an increase and a decrease in a total energy accumulated in the magnet. Therefore, there are many cases in which the symmetry of that portion is low, to which attention is paid.

When $f_{s=s0}(t')$ is obtained at s=$s_0$, values in the domain other than s=$s_0$ of f(s, t') can be estimated by interpolation or extrapolation with the use of those functions. That is, the following expression can be as approximate due to the first-order development using the generating compensation function and the species compensation function.

$$f(s,t')=f_{s=s0}(t')\times(s/s_0) \quad \text{(Ex. 1)}$$

This is the simplest approximating method which is representative of the generating compensation function using a specific species compensation function.

The species compensation functions $f_{s=sn}(t')$ for a large number of $s_n$(n=0, 1, 2, . . . ) are obtained, thereby being capable of further setting the generating compensation function (s, t') with high precision using the higher-order approximation. Also, even when the lower-order approximation is used as the generating compensation function f(s, t'), if a certain number of species compensation functions are excessively obtained in advance, the error can be verified by using the excessive functions, which is desirable.

When a nonlinear effect for s of the generating compensation function is to be taken, the above expression is further generalized and may be presented as the following expression.

$$f(s,t')=f_{s=s0}(t')\times h(s/s_0),$$

$$h(x)=\Sigma a_k \times x^k \quad \text{(Ex. 2)}$$

where symbol E represents a sum of k (k=1, 2, . . . K).
The h(x) is a K-order polynomial expression, and the order K is appropriately set according to a request for the acceptable error or the amount of calculation. A coefficient $a_k$ is obtained by a method such as a least squares method in which the species compensation functions $f_{s=sn}(t')$ are obtained for a large number of $s_n$(n=0, 1, 2, . . . ), and are well approximated. (Ex. 1) corresponds to a specific case in which K=1 is set in (Ex. 2).

When an asymmetric effect for positive and negative of s of the generating compensation function is to be taken, the above expression is generalized by using an expanded hyperbolic function, and may be presented as follows:

$$f(s,t')=f_{s=s0}(t')\times h'(s/s_0),$$

$$h'(x)=(\alpha\times\exp(\beta\times x)-(2-\alpha)\times\exp(-\beta\times x))/(\exp(\beta\times x)+\exp(-\beta\times x)) \quad \text{(Ex. 3)}$$

In this expression, α is a real number of 0 to 2. When α=1 is met, h' becomes the hyperbolic tangent function, which is a function form symmetric with respect to the positive and negative of x. α and β are so-called fitting parameters, and appropriately set according to a request for approximation. (Ex. 1) corresponds to a specific case in which α=1 and β=infinite in (Ex. 3).

For s=$s_n$ in a wide range, when a large number of species compensation functions $f_{s=sn}(t')$ are obtained, the generating compensation function (s, t') with higher precision can be represented by the following expression due to interpolation conducted by a linear combination of $f_{s=sm}(t')$ and $f_{s=sn}(t')$ for s satisfying $s_m<s<s_n$.

$$f(s,t')=\{f_{s=sm}(t')\times(s_n-s)+f_{s=sn}(t')\times(s-s_m)\}/(s_n-s_m) \quad \text{(Ex. 4)}$$

In this way, the generating compensation function for arbitrary (s, t') is obtained by appropriate interpolation with the use of the species compensation function of proximity which is discretely obtained.

Approximation is not limited to the approximation caused by the above-mentioned linear combination. This problem boils down to a general issue that, on the basis of values that are discretely given on two-dimensional grid points (or lines), functions that are consecutively defined on a two-dimensional plane that approximates those values are obtained. Therefore, diverse approximating methods related to the above problem can be used, and the processing method using a map on the grid can be also used.

As exemplified by (Ex. 2), (Ex. 3), and (Ex. 4) in the above, there are a variety of methods for approximately expressing the generating compensation function by using the species compensation function. Also, the specific approximating methods are not limited to the above examples. Further, those approximating method can be appropriately combined together to set the generating compensation function more excellent in the balance between the approximate precision and the amount of calculation.

Figure 5:
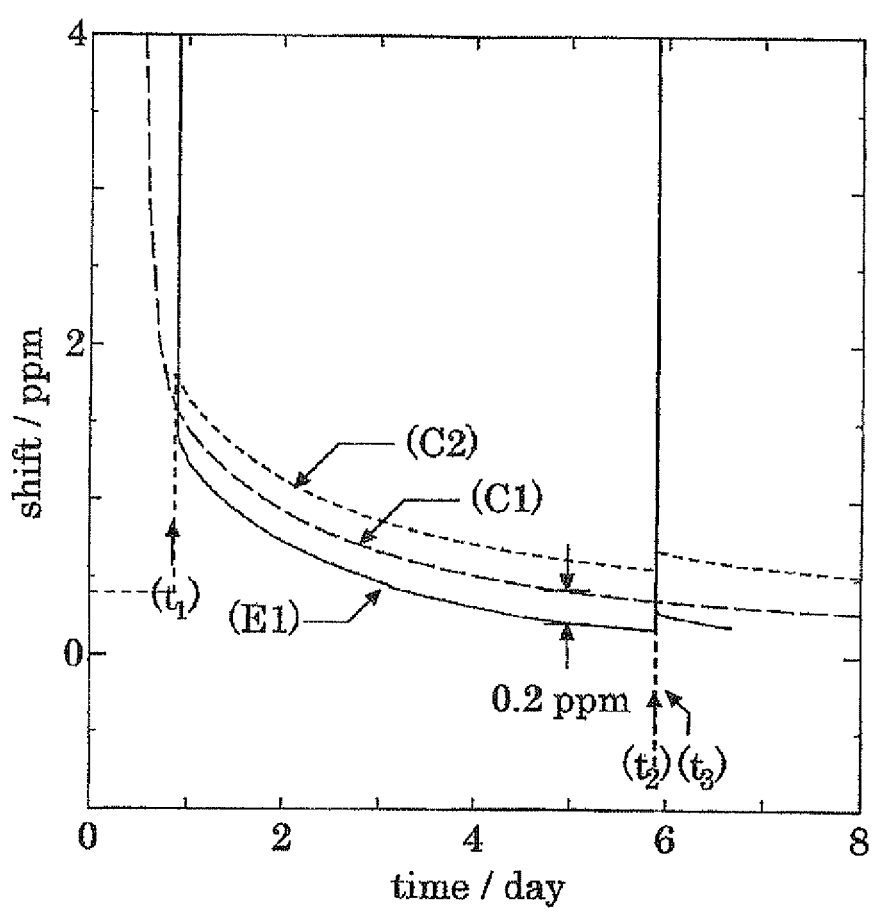
FIG. 5 is a graph illustrating a measured value and approximate curves of the magnetic field fluctuation of the superconducting magnet.

A description will be given with reference to experimental data illustrated in FIG. 5. FIG. 5 illustrates the measurement results of the magnetic field fluctuation in the sample space which is measured by the NMR illustrated in FIG. 1 with a change in the origin and the scale from another viewpoint. The abscissa represents time, the unit is day, and the origin is set so that a time t=0 is set at a left end of the figure. The ordinate represents the magnetic field B in the sample space, the unit is ppm, and the origin on the ordinate is set so that the value when the fluctuation caused by setting the shim recedes approximates to 0. Referring to FIG. 5, a portion indicated by a solid line (E1) corresponds to a value $B_0$ of the magnetic field when no compensation is conducted. In a section ($t_1$ to $t_2$) between the times $t_1$ and $t_2$, and a section ($t_3$ . . . ) after a time $t_3$, $B_0$ is originally 0. However, in those sections, $B_0$ is representative of a finite value due to an influence of the setting of the shim which is conducted immediately before in fact, and this value changes depending on time. In the compensation function, it is expected that the values of $B_0$ are offset in those sections ($t_1$ to $t_2$, $t_3$ . . . ). Hereinafter, a method of obtaining the effective compensation function in the used device will be specifically exemplified on the basis of the data.

In this experiment, the setting (u, w, s, t) of the shim described below are given at the times $t_1$, $t_2$, and $t_3$. The following setting at the time $t_0$ is the setting of a dummy for designating an initial state of the system. In this example, w=0 is treated as the setting representative of the step function as the type of operation.

$$(u_0,w_0,s_0,t_0)=(98.9,0,0,0)$$

$$(u_0,w_0,s_1,t_1)=(0,0,-98.9,75682)$$

$$(u_0,w_0,s_2,t_2)=(49.5,0,49.5,509086)$$

$$(u_0,w_0,s_3,t_3)=(0,0,-49.5,510006)$$

At the time $t_1$, the fluctuation of the step function form of $s_0$=−99 ppm is set to Z0. In the section ($t_1$ to $t_2$), a curve (E1) corresponds to the above magnetic field p(t). Focusing on this, the species compensation function $f_{s0=-99}(t')$ can be obtained. That is, the species compensation function $f_{s0=-99}(t-t_1)$ can be obtained as an approximate function that offsets the solid line (E1) in the figure in the section ($t_1$ to $t_2$).

In general, the magnitude of a phenomenon associated with relaxation can be expressed by the function of the amount of time t' represented by $\exp(-t'/\tau)$ by using a relaxation time $\tau$ characterizing that phenomenon. Referring to FIG. 1, in the same measurement results, the relaxation curves of $\tau$=one day and three days are shown by short dashed lines. The measurement values cannot be represented by the function. Conceivably, this is because the interaction with the shim coil is different in each position of the superconductor in the superconducting magnet, and also because a plurality of superconductors is used in the superconducting magnet.

The above relaxation phenomenon can be represented by the following general form as a total of the relaxations with diverse relaxation times $\tau$.

$$f_{s=s0}(t')=\Sigma a_m \times \exp(-t'/\tau_m) \qquad (Ex.\ 5)$$

where symbol $\Sigma$ represents a sum of m (m=1, 2, ... M-1). where $a_m$ and $\tau_m$ are fitting parameters, and the order M to be used is appropriately determined taking the acceptable error into account. They depend on the specific configurations of the superconducting magnet and the shim coil.

With the use of the function form of (Ex. 5), the fitting parameter $(a_m, \tau_m)$ is set so that the function approximates the experimental data, thereby enabling the species compensation function $f_{s0=-99}(t')$ to be obtained. More specifically, when it is assumed that the unit of the magnetic field is ppm, and the unit of the time is second, the following expression well approximates the experimental data.

$$f_{s=-99}(t')=0.04\times\exp(-t'/(3600\times2))+0.06\times\exp(-t'/(3600\times8))+0.46\times\exp(-t'/(3600\times24))+0.84\times\exp(-t'/(3600\times72)) \qquad (Ex.\ 6)$$

In this expression, the approximation of the order M=4 is set for prioritizing that the amount of calculation is reduced, and the relaxation time $\tau_m$ is set to round four values of 2 to 27 hours for prioritizing an experimental request and the ease of interpretation. In order to further enhance the precision of approximation, it is preferable to increase the order as needed, and also arbitrarily set the combination of the relaxation times to be used for optimization.

Referring to FIG. 5, a curve indicated by a long dashed line of (C1) shows $f_{s=-99}(t')$ in (Ex. 6), which is drawn with being shifted up by 0.2 ppm with an origin of the time $t_1$ for facilitation of distinction from (E1). That is, the curve (C1) in the figure represents $f_{s=-99}(t-t_1)+0.2$ ppm. The curves illustrated in the figure approximate each other within an error range of 0.01 ppm in the measurement results. When the curve (C1) is drawn without being shifted, in the section ($t_1$ to $t_2$), the curve (C1) completely coincides with the curve (E1), and cannot be distinguishable therefrom.

The generating compensation function f(s, t') for the term of the Z0 in this embodiment is obtained by taking asymmetry in the method represented by (Ex. 3) so as to approximate the measured value in a wide range by using the species compensation function $f_{s0=-99}(t')$, and setting the fitting parameter so as to give excellent approximation. The following expression specifically represents the obtained generating compensation function (s, t').

$$f_A(s,t')=f_{s=-99}(t')\times h'''(s/99)$$

$$h'''(x)=-0.96\times(1.04\times\exp(9.9\times x)-(0.96)\times\exp(-9.9\times x))/(\exp(9.9\times x)+\exp(-9.9\times x)) \qquad (Ex.\ 7)$$

With the generating compensation function $f_A(s, t')$ thus obtained, as will be described later, the fluctuation of the magnetic field intensity due to the history of the setting of the shim can be compensated within the error range of 0.01 ppm.

A specific example of the generating compensation function described above is described for facilitation of deeply understanding the method of obtaining and setting the generating compensation function. It should be noted that the generating compensation function satisfying the conditions is not limited to the above function.

In fact, the values of the compensation function $g_A(t)=\Sigma f_A(s_n, t-t_n)$ can be obtained by using the generating compensation function $f_A$ obtained above in the overall section of the time t. In this expression, symbol $\Sigma$ represents a sum of n (n=1, ... N-1). Also, the number of times N of the conducted setting is N=2 in the section ($t_1$ to $t_2$), and N=4 in the section ($t_3$ ... ).

Referring to FIG. 5, a short dashed line indicated by (C2) is drawn with the compensation value thus calculated being reversed in a negative sign and shifted up by 0.4 ppm. That is, the curve C2 represents the curve of "−g(t)+0.4 ppm". When the curve (C2) is drawn without being shifted, in the section ($t_1$ to $t_2$) and the section ($t_3$ ... ), the curve (C2) completely coincides with the curve (E1), and is not distinguishable therefrom.

This presents that the fluctuation found in the measured value in the figure can be compensated by adding the correction represented by the compensation function g(t) to the setting of the shim.

The above is summarized, and specific numerical values of the respective measured values and function values are shown in Table 1. The time t is shown at the leftmost column of Table 1. The other columns show the respective measured values and function values at the respective times t. Starting from the left, there are shown the values "p(t)" of the magnetic field when no correction is conducted, the species compensation function "$f_{s=-99}(t-t_1)$" represented by (Ex. 6), the compensation values inversed in sign "−g(t)", and values of the values "p(t)+g(t)" of the magnetic field when the compensation is conducted. The times $t_1$, $t_2$, and $t_3$ at which the setting is conducted are noted in remarks column.

TABLE 1

| t/day | p(t)/ppm | f(t − $t_1$)/ppm | −g(t)/ppm | (p(t) + g(t))/ppm | remarks |
|---|---|---|---|---|---|
| 0.000 | 98.853 |  | 0.000 |  |  |
| 0.500 | 98.854 | 5.407 | 0.000 |  |  |
| 0.875 |  | 1.400 |  |  | t1 |
| 1.000 | 1.262 | 1.262 | 1.263 | −0.001 |  |
| 1.500 | 0.928 | 0.937 | 0.938 | −0.009 |  |
| 2.000 | 0.730 | 0.729 | 0.729 | 0.001 |  |
| 2.500 | 0.589 | 0.580 | 0.580 | 0.009 |  |
| 3.000 | 0.477 | 0.469 | 0.469 | 0.008 |  |
| 3.500 | 0.381 | 0.384 | 0.384 | −0.002 |  |
| 4.000 | 0.314 | 0.317 | 0.317 | −0.002 |  |
| 4.500 | 0.256 | 0.263 | 0.263 | −0.007 |  |
| 5.000 | 0.218 | 0.220 | 0.220 | −0.002 |  |
| 5.500 | 0.188 | 0.184 | 0.184 | 0.004 |  |
| 5.893 |  | 0.161 |  |  | t2 |
| 5.903 |  | 0.160 |  |  | t3 |
| 6.000 | 0.263 | 0.155 | 0.263 | 0.000 |  |
| 6.500 | 0.203 | 0.130 | 0.209 | −0.006 |  |
| 7.000 |  | 0.110 | 0.170 |  |  |
| 7.500 |  | 0.093 | 0.141 |  |  |
| 8.000 |  | 0.079 | 0.117 |  |  |

That the absolute value of "p(t)+g(t)" in the section ($t_1$ to $t_2$) and the section ($t_3$ ... ) is 0.01 ppm, or lower can be read from Table 1. This shows that the magnetic field fluctuation caused by the influence of the setting of the shim can be suppressed to 0.01 ppm or lower by the compensation according to the present invention.

Second Embodiment

In this embodiment, a description will be given of a method of applying the present invention when the setting of the shim is given as a sequential change. The method of this embodiment approximates the sequential change of the setting with small stepwise changes.

This is realized by recording a change history of the shim at sufficiently small time intervals when the sequential change is set in the shim. More specifically, this embodiment is implemented in such a manner that when an arbitrary waveform is set, the setting of the waveform is approximated by combining a large number of small stepwise settings, and the stepwise setting of the approximation is continuously given to the method of the first embodiment.

In this method, when the precision of the approximation is to be enhanced, a capacity for storing the setting history, and the amount of calculation when calculating the compensation value are increased, to which attention needs to be paid. On the other hand, since the generating compensation function of the first embodiment which is obtained in the setting of the stepwise function form is used as it is, it is advantageous in that a prior specific provision is not required.

Third Embodiment

This embodiment shows an example in which a method of the second invention is applied when the type of operation of the setting is a square wave. In the method according to the second invention, a value of the operation amount w must be scalar.

In the experimental example illustrated in FIG. 5, the shim setting of a square wave (pulse) is conducted between the times ($t_2$) and ($t_3$). In the first embodiment, this pulse is treated as two stepwise changes including the stepwise change at the time ($t_2$) and the stepwise change at the time ($t_3$). On the other hand, one pulse combining two changes together can be regarded as one setting of the shim. In this case, the generating compensation function is defined for the setting of the shim of the pulse shape.

Since the pulse is characterized by a wave height (h) and a width (dt), the operation amount s becomes an array (h, dt) having those two elements. Also, since the magnitude of the pulse is characterized by the wave height×width, the scalar operation amount s' represented by s'=h×dt can be more easily used. Hence, for example, the generating compensation function represented by the following expression can be used.

$$f'(s,t')=f'(h,dt,t')=f'_{h=h0,dt=dt0}(t')\times g(s'/s0')$$

$$g(x)=\Sigma a_k \times x^k \qquad (Ex. 8)$$

In this expression, for simplification, the species compensation function $f'_{h=h0,dt=dt0}(t')$ that approximates a case of ($h=h_0$, $dt=dt_0$) is used.

The above method for representatively indicating the operation amount of the setting of the pulse shape by its area can be applied to not the square pulse but a pulse of an arbitrary waveform. That is, the pulse of the arbitrary waveform is characterized by an area s' which is a value obtained by integrating a height of the waveform with time instead of h×dt in the case of a square.

In this embodiment, the generating compensation function f'(h, dt, t') for the setting of the pulse shape is defined with t'>dt/2 as a domain assuming that the amount of time t' is measured from a center of the pulse. When it is assumed that the generating compensation function for the step function is f, f and f" have a relationship represented by the following expression.

$$f'(h,dt,f)\sim f(h,t'+dt/2)+f(-h,t'-dt/2) \qquad (Ex. 9)$$

In this expression, the symbol "~" indicates that the both sides of this expression equal to each other within the error. Considering that a right side and a left side of an expression approximate the same, this relationship is obvious.

In this expression, if a response of the system has a temporal correlation (response is changed depending on a state immediately before), an error corresponding to the magnitude of the correlation occurs in the measured value as dt is smaller at a right side of the expression, to which attention is paid. That is, when a plurality of settings of the shim is conducted in a short time, there is a possibility that the error occurs in the compensation made by the expression at the right side (the methods according to the first embodiment and the second embodiment). For that reason, when it is assumed that the setting of a specified combination is repetitively conducted, it is effective to treat a series of settings as the setting of one pulse shape as in this embodiment.

The generating compensation function f' is defined as a function that approximates the measured value as with the generating compensation function f. In data processing, the operation amount s of the setting in the first embodiment is replaced with the operation amount s' of the setting which has been converted into the scalar quantity in this embodiment. As a result, the method according to the first embodiment can be applied as it is.

In this way, the shimming method according to the present invention can be implemented in the same method with the use of the generating compensation function suitable for the operation of the shim even if the operation of the shim is of the step shape or the arbitrary waveform. Even in the arbitrary waveform, the operation amount s can be converted into the scalar quantity by integrating the height h of the waveform with the time t to obtain the area s'. Therefore, the method according to the second invention can be applied.

On the other hand, when the operation amount of the setting is not represented by only the size of the waveform, the operation amount is treated as an array, and the generating compensation function corresponding to the array is allocated for treatment.

Fourth Embodiment

The generating compensation function for the term of the Z0 of the shim can be obtained by the normal NMR measurement as described in the first embodiment. Then, a description will be given of the measuring method when obtaining the generating compensation function for the terms other than the Z0 of the shim. For example, a first-order term (Z1, X1, Y1) of the shim is a term for correcting the gradient of the magnetic field (intensity of the magnetic field per a unit length) along the respective axes. Therefore, in order to obtain the generating compensation function related to this term, a change of the distribution of the magnetic field within the measurement space with time must be measured.

Figure 6:
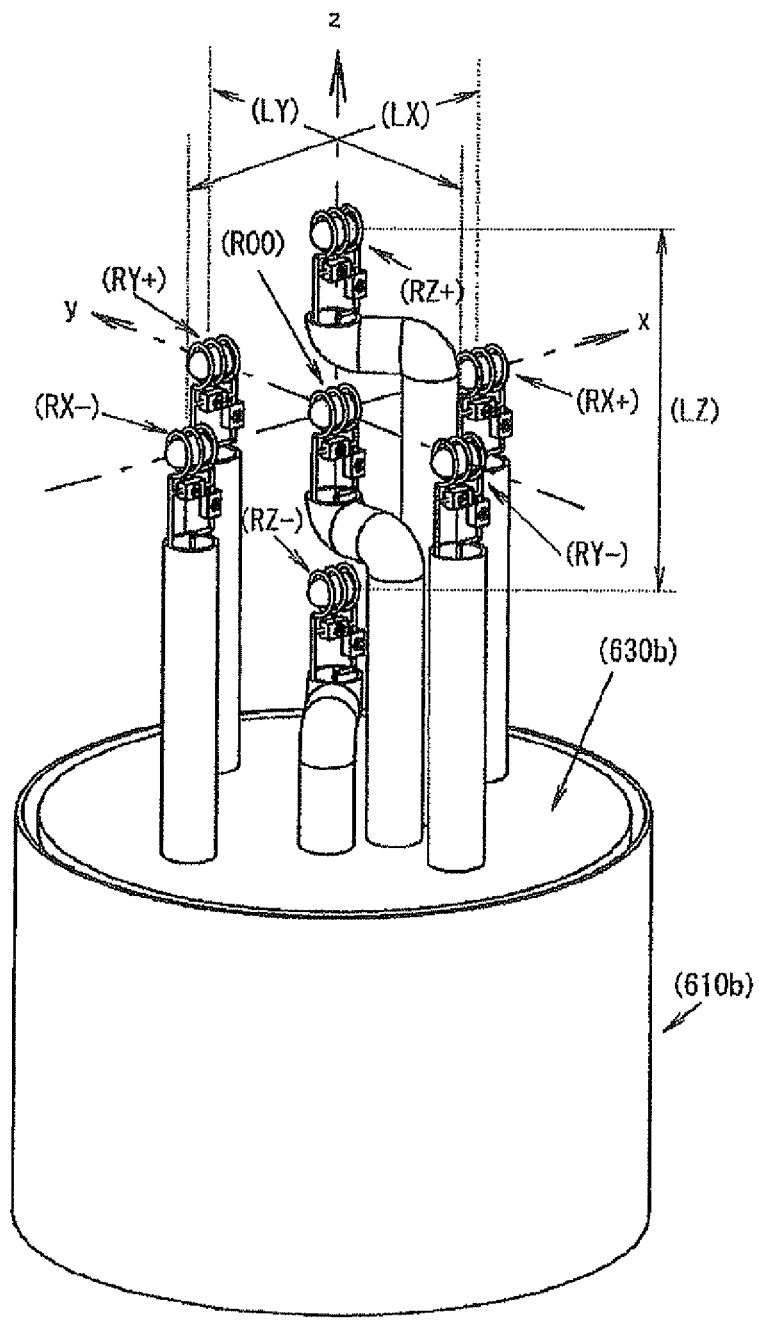
FIG. 6 is a perspective view illustrating a resonator neighborhood of an NMR probe device according to a fifth embodiment.

FIG. 6 illustrates a portion of a resonator neighborhood of the NMR probe device having seven probe elements within the measurement space as an example of the probe device according to the fourth invention. Referring to FIG. 6, for facilitation of understanding the features of the probe device, a portion below a resonator mounting (630b) of a cylindrical housing (610b) is omitted.

Figure 7:
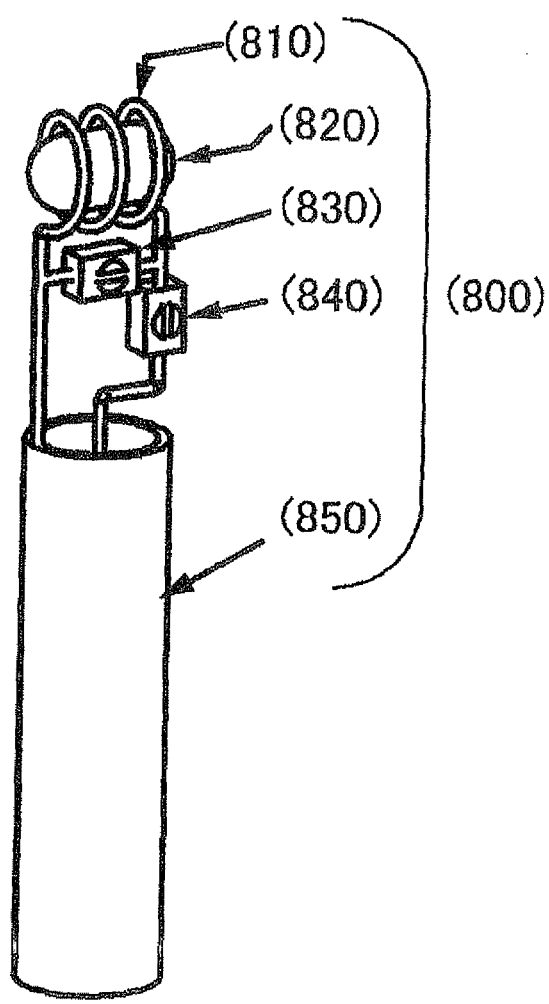
FIG. 7 is a perspective view illustrating the NMR probe element according to the fifth embodiment.

As illustrated in FIG. 7, each NMR probe element (800) includes a measurement coil (810), a standard sample (820) disposed within the measurement coil (810), a tuning capacitor (830) connected in parallel to the measurement coil (810), and used for mainly adjusting a resonance frequency, a matching capacitor (840) inserted between the measurement coil (810) and a transmission line, and used for mainly adjusting impedance matching, and a coaxial cable (850) performing a transmission line of a measurement high-frequency signal. The respective parts are connected to each other by brazing. A resonator is configured by the measurement coil (810) and the tuning capacitor (830). All of those parts are made of nonmagnetic material so as not to affect the NMR measurement. The nonmagnetic property is not at least a ferromagnetic property, and has no large value of paramagnetic susceptibility and the like.

Figure 8:
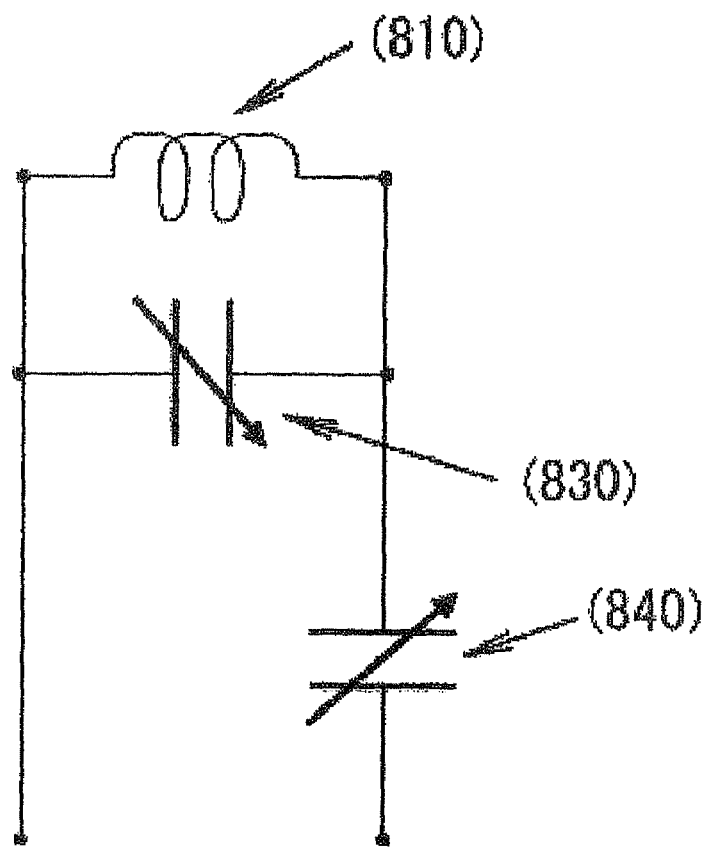
FIG. 8 is a circuit illustrating an equivalent circuit of the NMR probe element according to the fifth embodiment.

An electric equivalent circuit of the resonator neighborhood in the NMR probe element (800) is illustrated in FIG. 8. The respective capacitors of the tuning capacitor (830) and the matching capacitor (840) are configured by appropriately connecting a variable capacitor and a fixed-capacitance capacitor in parallel or in series, and have a certain degree of variable range.

The NMR probe element (800) only needs to obtain the lowest NMR signal. For that reason, a withstand voltage of the capacitors does not require that of the normal NMR probe. Therefore, a small-sized chip part can be used.

When a so-called semi-rigid coaxial cable is used as the coaxial cable (850), the measurement coil (810) can be supported by the coaxial cable (850). The coaxial cable (850) is fixed to the resonator mounting (630b).

A position of the resonator is shown with the center of the measurement coil as a reference point. The respective resonators are symmetrically arranged on the origin, and the respective axes of the X-axis, the Y-axis, and the Z-axis, and denoted by symbols (R00), (RX−), (RX+), (RY−), (RY+), (RZ−), and (RZ+). Also, a distance between the resonator (RX−) and the resonator (RX+) is denoted by (LX), a distance between the resonator (RY−) and the resonator (RY+) is denoted by (LY), and a distance between the resonator (RZ−) and the resonator (RZ+) is denoted by (LZ).

Any standard samples are available if an NMR signal with some degree of sharpness is obtained. Among them, deuterium water ($D_2O$) in which hydrogen atoms (H) in water ($H_2O$) are replaced with deuterium atoms (D) is an optimum sample because treatment is easy, and the resonance frequency is reasonable. In the NMR device using 1H-930 MHz magnet, the resonance frequency of the NMR of diplon is about 143 MHz. In the frequency of this degree, when the resonator is configured by a coil and a capacitor, a size of the resonator is sufficiently small as compared with the wavelength, and a so-called lumped parameter circuit treatment is efficient. This results in such advantages that the design and adjustment of the resonator are easy. In particular, when a selective switch (switch) is inserted between the probe element and a spectrometer so that the probe element to be measured can be easily selected, in order to suppress the insertion loss of the switch, it is preferable that the measurement frequency is lower.

In this embodiment, deuterium water is used as the standard sample. The deuterium water is sealed in a resin tube by melting the resin. A method of sealing the sample in the tube is not limited to melting of the resin, but can be conducted by resin of a rubber closure or adhesive. In this way, since deuterium water is small in natural abundance ratio, a contaminating signal from a vessel in use is not a concern, resulting in such an advantage that option of its material is wide. A deuterated solvent such as deuterated chloroform is also similarly available. However, because the deuterated solvent is low in boiling point, there is a difficulty in requiring a technique for sealing in the tube.

When the NMR measurement is conducted by the aid of a probe element E (E=R00, RX−, RX+, . . . ), a resonance frequency $F_E$ at that position is obtained. A magnetic gradient $DF_x$ along the X-axis is represented by $DF_x=(F_{Rx+}-F_{Rx-})/LX$. The $DF_x$ corresponds to the term X1 of the shim.

In this embodiment, a probe element (R00) located in the center (origin) of the magnetic field can be used not only for obtaining the generating compensation function for the term of the Z0, but also for verification of the measured value of the higher-order term. Naturally, even if the magnetic gradient fluctuates due to the setting of the shim of the higher-order term, the magnetic field of the origin would not fluctuate. If the magnetic field of the origin largely fluctuates, there is a high possibility that a positional relationship of the superconducting magnet, the shim coil, and the probe, or the setting of a conversion expression within the shim coil driving device is displaced. Therefore, the displacement of the setting should be corrected.

As development of this embodiment, in the normal NMR probe in which the NMR measurement coil is arranged in the origin, there can be configured a probe in which the probe elements are appropriately arranged in an unoccupied space so as to perform both of the normal measurement and the magnetic gradient measurement.

A selector switch using a high-frequency relay can be inserted between the probe and the NMR spectrometer. Further, selection of the probe elements is designated during a pulse sequence, and on the basis of the designation, the selector switch can be controlled. With this configuration, a plurality of the probe elements can conduct the measurement in parallel by time sharing, thereby remarkably reducing the measurement time.

As one device for measuring the magnetic field distribution within the measurement space, there is a shim robot that obtains the distribution of the magnetic field by scanning the space. However, in the present invention, since not the absolute value of the magnetic field, but a change of the magnetic field with time is important, the diversion of the shim robot is not proper. This is because travel of the shim robot within the probe adversely affects the measurement.

PRIOR ART DOCUMENTS

Patent Document

PATENT DOCUMENT 1: JP-A-2001-218750

Non-Patent Document

NON-PATENT DOCUMENT 1: Experimental Chemical Course 8 "NMR/ESR", Ver. 5, The Chemical Society of Japan (Maruzen, 2006)

The invention claimed is:

1. A shim coil control device that compensates stability and homogeneity of a magnetic field of a superconducting magnet with a shim coil,
wherein the shin coil control device comprises a computer programmed to output a signal to a shim coil driving device for controlling at least one term of the shim, and
wherein the shim coil control device is programmed to provide
(1) a shin setting recorder that records, when the setting of the shim is conducted:
a set value u of the shim;
a type w of the set operation;
an amount s of the operation of the setting; and
the time t of setting,
by associating each setting with an index n as $(w_n, u_n, s_n, t_n)$, wherein the index n is a value of 0 to N−1, where the number of times of setting is N, and the value of index n associated with the setting finally conducted is N−1;

(2) generating compensation function supply that supplies a preset generating compensation function $f^w(s,t')$ that is a function having the type w of the operation, the amount s of the operation of the setting, and the amount of time t' as arguments, the generating compensation function having a property to become 0 when the amount of time t' is infinite, and is set so as to approximately compensate a magnetic field fluctuation attributable to individual setting;

(3) compensation value calculator that refers to the generating compensation function supply and the shim setting recorder, and calculates a compensation value at the time t by the aid of a compensation function $g(t)$ that is a function of the time t which is expressed as $g(t)=\Sigma f^{w_n}(s_n, t-t_n)$ by the generating compensation function and the setting of the shim conducted before the time t; and (4) an output value computer that computes a compensation value u' by adding the compensation value obtained by the compensation value calculator and a latest set value $u_{N-1}$ that is $u'=u_{N-1}+g(t)$.

2. The shim coil control device according to claim 1, wherein the generating compensation function is expressed as $f^w_{s=s_0}(t') \times h(s/s_0)$ assuming that the generating compensation function $f^w(s_0, t')$ when the operation amount s of setting has a specific value $s_0$ is a species compensation function $f^w_{s=s_0}(t')$ which is a function of the amount of time t', the operation amount s of setting is normalized by the aid of $s_0$, and a polynomial function h of the normalized operation amount $s/s_0$ is $h(s/s_0)$.

* * * * *